(12) United States Patent
Zhang et al.

(10) Patent No.: US 11,274,234 B2
(45) Date of Patent: Mar. 15, 2022

(54) ADHESIVE COMPOSITION FOR TEMPORARY BONDING OF SEMICONDUCTOR WORKPIECE AND SUPPORT CARRIER PAIR

(71) Applicant: Chengdu ESWIN SiP Technology Co., Ltd., Chengdu (CN)

(72) Inventors: Chunbin Zhang, San Jose, CA (US); Xiaotian Zhou, San Jose, CA (US); Minghao Shen, San Jose, CA (US); Yijiang Hu, San Jose, CA (US); Shaolin Zou, San Jose, CA (US)

(73) Assignee: CHENGDU ESWIN SIP TECHNOLOGY CO., LTD., Chengdu (CN)

(*) Notice: Subject to any disclaimer, the term of this patent is extended or adjusted under 35 U.S.C. 154(b) by 0 days.

(21) Appl. No.: 16/297,394

(22) Filed: Mar. 8, 2019

(65) Prior Publication Data

US 2019/0276712 A1 Sep. 12, 2019

Related U.S. Application Data

(60) Provisional application No. 62/640,529, filed on Mar. 8, 2018, provisional application No. 62/640,527, filed on Mar. 8, 2018.

(51) Int. Cl.
| | |
|---|---|
| *C09J 11/08* | (2006.01) |
| *C09J 201/00* | (2006.01) |
| *C09J 11/06* | (2006.01) |
| *H01L 21/683* | (2006.01) |
| *H01L 21/66* | (2006.01) |

(Continued)

(52) U.S. Cl.
CPC ............ *C09J 11/08* (2013.01); *C09J 5/00* (2013.01); *C09J 11/00* (2013.01); *C09J 11/06* (2013.01); *C09J 201/00* (2013.01); *H01L 21/6835* (2013.01); *H01L 22/12* (2013.01); *C09J 2203/326* (2013.01); *C09J 2301/502* (2020.08); *H01L 2221/68327* (2013.01)

(58) Field of Classification Search
CPC ............ H01L 21/6835; H01L 22/12; H01L 2221/68304; H01L 2221/68327; H01L 2221/6834; B32B 41/00
See application file for complete search history.

(56) References Cited

U.S. PATENT DOCUMENTS

2014/0130962 A1* 5/2014 Yu .................. H01L 21/02057
156/154
2014/0309327 A1* 10/2014 Nogami ............. C08F 290/061
522/173

(Continued)

*Primary Examiner* — George R Koch
(74) *Attorney, Agent, or Firm* — Scully Scott Murphy & Presser

(57) ABSTRACT

Disclosed is an adhesive composition for temporarily bonding a semiconductor workpiece and support carrier pair with improved adhesive film properties. The adhesive composition may include one or more polymer resins, solvents, and a small but critical quantity of surfactants, among others. In operation, the one or more surfactants may improve film continuity, leveling, and reduce voids and defects. Sample semiconductor workpiece includes a semiconductor silicon wafer and sample support carrier includes rigid semiconductor silicon or glass, sapphire or other rigid materials.

4 Claims, 1 Drawing Sheet

(51) Int. Cl.
*C09J 5/00* (2006.01)
*C09J 11/00* (2006.01)

(56) References Cited

U.S. PATENT DOCUMENTS

| | | | | |
|---|---|---|---|---|
| 2016/0133486 A1* | 5/2016 | Andry | ............... | B32B 43/006 |
| | | | | 428/40.4 |
| 2016/0168422 A1* | 6/2016 | Iwai | ............... | C09D 125/06 |
| | | | | 428/339 |
| 2017/0326850 A1* | 11/2017 | Yoshioka | ............ | B32B 27/286 |

* cited by examiner

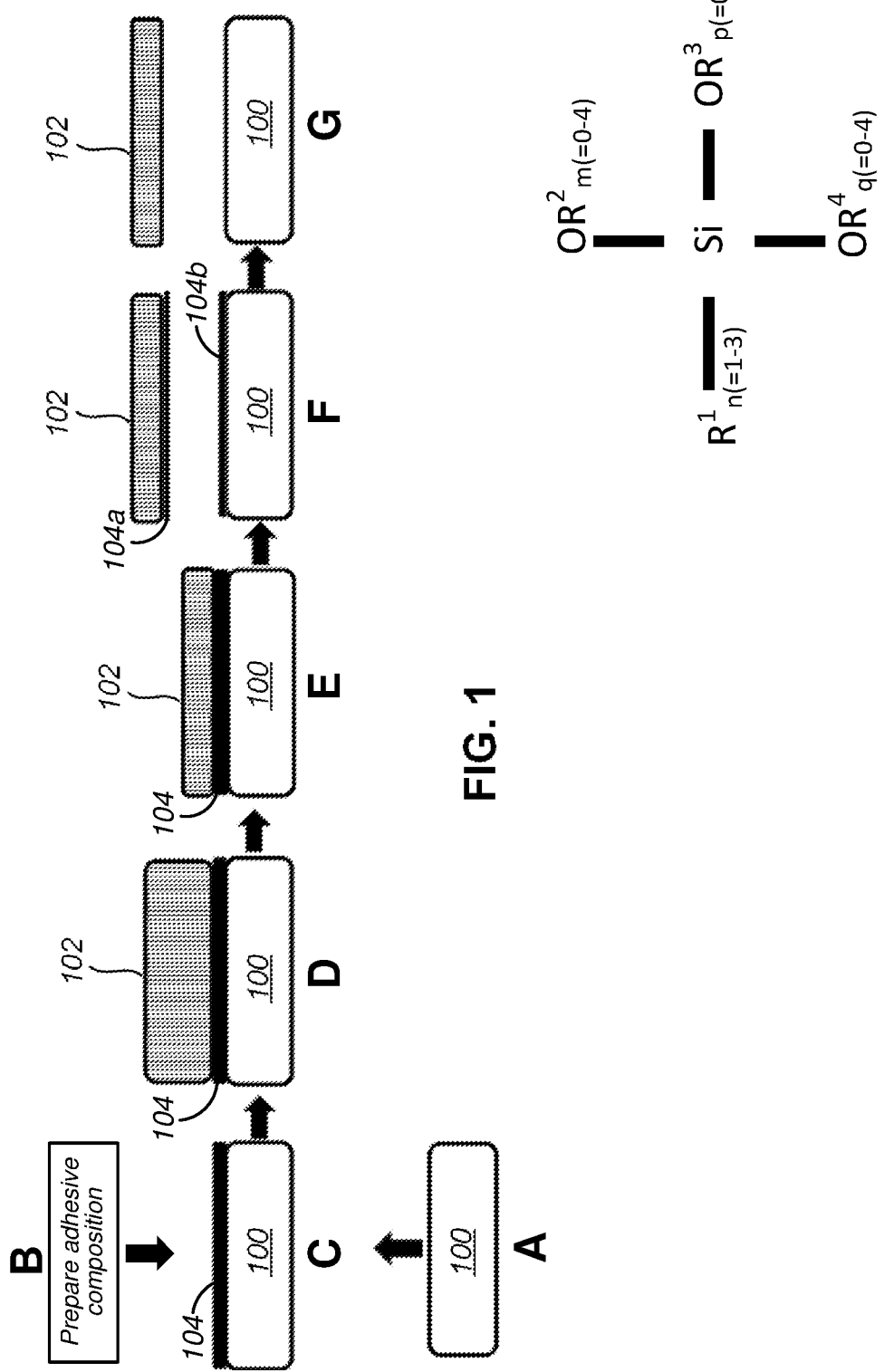

ADHESIVE COMPOSITION FOR TEMPORARY BONDING OF SEMICONDUCTOR WORKPIECE AND SUPPORT CARRIER PAIR

RELATED APPLICATIONS

This application claims priority to U.S. provisional application No. 62/640,527 filed on Mar. 8, 2018 and to U.S. provisional application No. 62/640,529 filed on Mar. 8, 2018. Each of the above applications is incorporated by reference in its entirety.

FIELD OF THE INVENTION

The present disclosure relates to semiconductor packaging technologies.

BACKGROUND

The past several decades have seen steady advances in the field of electronics that have included ongoing miniaturization of semiconductor devices. These improvements have been driven by strong market demand for ever-improving electronics that can provide such things as faster processing, longer battery life, smaller device profiles, and lower prices. For many years, miniaturization of semiconductor devices meant reducing gate length or minimum feature size, which is a lateral wafer dimension. However, as size of semiconductor features began to approach predicted silicon limits, researchers began seeking alternatives to gate size for continued improvements. As a result, for the past several years, wafer thickness has been a focus for continued miniaturization, so there has been an ongoing interest in improved processes for reducing wafer thickness and handling thinner wafers.

Today semiconductor manufacturing often includes wafer-thinning processes, such as mechanical grinding, chemical mechanical polishing (CMP), wet etching and atmospheric downstream plasma (ADP) dry chemical etching (DCE). These processes are applied to the wafers after fabrication of electrical interconnects, such as solder bumps, on the wafer. The thinned wafer advantageously can allow for 3D IC chip stacking in system-in-package (SiP) solutions, flexible electronics and display development, and improved heat dissipation.

On the other hand, thinned wafers are more susceptible to warping, cracking, and fracturing. Semiconductor wafers can be exposed to a variety of manufacturing processes that have the potential to damage a thin wafer, such as photolithography, etching, plating, vacuum deposition, alkaline or acidic rinses, reactive ion etching, grinding, chemical-mechanical polishing (CMP), and so on. During the manufacturing process, the wafer will generally be tested several times to check for defects from a previous step. If there are too many defects on a wafer, the entire wafer must be thrown away, resulting in lost time and revenue.

Therefore, it is important to find ways to mitigate or avoid damage to the wafer during manufacturing. A proposed solution has been to support the thinned wafer with a support carrier by bonding the thinned wafer to the support carrier with a temporary adhesive. However, it has been found that this technique can be hindered if the adhesive fails to maintain good adhesion to the support carrier because the support carrier will fail to provide adequate support for mitigating or avoiding wafer damage. Good adhesion is especially important when the adhesive is exposed at the edges of the support carrier or when the total device pieces area is smaller than the support carrier area, such as during the manufacturing of fan-out wafer-level packaging when rectangular panels are typically used.

Thus, adhesives used to create a temporary bond during semiconductor manufacturing processes should reliably adhere to both a semiconductor workpiece (e.g., semiconductor wafer) and a support carrier. It is also desirable for adhesive films applied via slit coating or spray to have flow properties that allow for adequate settling so that the adhesive film will be substantially free of film defects, such as voids, foreign particles, and non-uniformity in thickness.

Thus, there exists a need for improvements in temporary adhesives resulting in better adhesion to bonded substrates and better resistance to semiconductor manufacturing processes. There also exists a need for improvements in temporary adhesives resulting in better film-flow properties, such as wetting, continuity, leveling, and anti-foaming, to reduce the occurrence of low film voids and other defects.

BRIEF SUMMARY

In some embodiments, a composition according to the present disclosure comprises a first component comprising at least one of a resin and a resin precursor, the first component being configured to adhere to at least one of a semiconductor workpiece and a support carrier, a second component comprising at least one surfactant that, when combined with the first component, can function as at least one of a wetting agent, a leveling agent, and an anti-foaming agent, and a solvent that, when combined with the first and second components, is configured to maintain resulting combination in liquid form.

In some embodiment, the composition can include at least one additive. In some such embodiment, the at least one additive includes at least one of an antioxidation agent, a UV stabilizer, a photo initiator, a filler, and an adhesion promotor.

In some embodiments, the first component comprises a UV curable resin. In some such embodiments, the composition further comprises a photo-initiator catalyst. In alternative embodiments, the composition further comprises a UV stabilizer.

In some embodiments, the second component comprises an anionic surfactant.

In some embodiments, the second component comprises a defoaming surfactant.

In some embodiments, the second component comprises hydrocarbons. In some such embodiments, the second component comprises a nonionic surfactant. In alternative embodiments, the second component comprises a polymeric surfactant.

In some embodiments, the solvent is configured to maintain the resulting combination in liquid form for only a desired period of time.

In alternative embodiments, the composition comprises a first component comprising at least one of a resin and a resin precursor, the first component being configured to adhere to at least one of a semiconductor workpiece and a support carrier, a second component comprising at least one of a catalysts and an additives, the second component being configured for enhancing at least one of film forming capability, maintain a liquid form, thermal stability, and dissolution capability, and a solvent that, when combined with the first and second components, is configured to maintain resulting combination in liquid form.

In some embodiments, the composition further comprises at least one additive. In some such embodiments, the at least one additive includes an adhesion promotor.

According to another aspect of the present disclosure, a method of manufacturing a semiconductor device comprises providing a semiconductor workpiece and a support carrier in a manufacturing environment, detecting at least one property of at least one of the semiconductor workpiece, a support carrier, and the manufacturing environment, preparing an adhesive for temporarily bonding the semiconductor workpiece and the support carrier together, the preparing of the adhesive being based at least in part on the at least one property, and forming an adhesive layer of the adhesive on at least one of the semiconductor workpiece and the support carrier.

In some embodiments, the preparing of the adhesive includes combining a first component comprising at least one of a resin and a resin precursor, the first component being configured to adhere to at least one of the semiconductor workpiece and the support carrier, a second component to the first component, the second component comprising at least one surfactant that, when combined with the first component, can function as at least one of a wetting agent, a leveling agent, and an anti-foaming agent, and a solvent that, when combined with the first and second components, is configured to maintain resulting combination in liquid form. In some such embodiments the preparing of the adhesive includes combining at least one additive to the fist component, the second component, and the solvent. In some such embodiments, the at least one additive includes at least one of an antioxidation agent, a UV stabilizer, a photo initiator, a filler, and an adhesion promotor.

In some embodiments, the preparing of the adhesive includes combining a first component comprising at least one of a resin and a resin precursor, the first component being configured to adhere to at least one of a semiconductor workpiece and a support carrier, a second component comprising at least one of a catalysts and an additives, the second component being configured for enhancing at least one of film forming capability, maintain a liquid form, thermal stability, and dissolution capability; and a solvent that, when combined with the first and second components, is configured to maintain resulting combination in liquid form.

BRIEF DESCRIPTION OF THE DRAWINGS

FIG. 1 is a schematic view of a semiconductor wafer temporary bonding and debonding process.

FIG. 2 is a schematic general structure of silicon containing adhesion promoters.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

This disclosure relates to an adhesive composition that is suitable for temporarily bonding a semiconductor workpiece and to a support carrier. In semiconductor wafer packaging processes, a wafer can be a semiconductor wafer or device wafer that has thousands of chips on it. Thin wafers, especially ultra-thin wafers (i.e., having a thickness less than 60 microns or even 30 microns) are very unstable, and more susceptible to stress than traditional thick wafers. During processing, thin wafers can easily be broken or warped, so such semiconductor workpieces are temporarily bonded to rigid support substrates to prevent or mitigate damage.

Widespread application of smartphones, tablets, and portable consumer electronics are driving semiconductor packaging towards thinner, smaller, and more integrated directions. Wafer-level packaging (WLP) techniques are rapidly reducing the size of packages for easier integration into mobile electronics. Therefore, wafer thinning processes used in device miniaturization and packaging has attracted more and more attention. Thin wafers offer the benefits of improved heat dissipation, three-dimensional (3D) stacking, reduced resistance, and substrate flexibility. In through silicon via (TSV) based 3D-IC wafer level packaging, wafers need to be thinned to less than 100 microns. The thinning process needs to be high throughput and low cost to be suitable for volume production.

In wafer level fanout packaging, the semiconductor workpiece and support carrier can for some embodiments be round, and for alternative embodiments, they can be square or rectangularly-shaped panels. Embodiments of support substrates can be made of made of glass, sapphire, metal, or other rigid materials to increase chip volume. In some wafer-level fanout methods, chips can be temporarily placed on an adhesive-coated panel, then encapsulated with epoxy molding compounds, and then thinned, polished, and processed with semiconductor packaging operations such as, for example, plating, metal vacuum deposition, photolithography, and etching. Finally, the encapsulated chips may be debonded from the support carrier, e.g., glass panel, and cut into individual chips.

Reference is made to FIGS. 1A-1G, which show a schematic block diagram of an embodiment of a process for temporarily bonding and debonding a support carrier 100 and a semiconductor workpiece 102. In FIG. 1A, a support carrier 100 is provided for temporarily supporting a semiconductor workpiece 102. The process shown in FIGS. 1A-1G can apply to embodiments in a variety of technologies, for example where the semiconductor workpiece 102 is being processed to produce optical lenses, semiconductors, liquid crystal displays (LCD), and solar panels. As a result, the shapes and materials of semiconductor workpieces 102 and support carriers 100 can vary for the various different embodiments. Shapes of semiconductor workpieces 102 and support carriers 100 can include, for example, round, rectangular, or square, and materials in the semiconductor workpieces 102 and support carriers 100 can include, for example, silicon, gallium arsenide, sapphire, glass, or metal. The thicknesses of the semiconductor workpieces 102 and support carriers 100 can also vary.

In FIG. 1B, an adhesive composition according to the present disclosure is prepared, or, alternatively, a previously-prepared adhesive is provided. In some embodiments, the adhesive can be prepared, modified, or selected from plural available adhesives while the wafer 102 is undergoing Front End of Line (FEOL) processing, undergoing Back End of Line (BEOL) processing, or awaiting application of the adhesive (FIG. 1C). Such embodiments allow for the adhesive to be customized or selected based on current conditions, such as environment temperature or humidity or characteristics and condition of the workpiece or carrier, such as adjusting for damage to the workpiece that may have occurred during manufacturing that may have weakened the workpiece without rendering it unusable. In FIG. 1C, an adhesive layer 104 is formed from the adhesive provided in FIG. 1B on the support carrier 100 by coating some or all of the upper surface of the support carrier 100 with the adhesive, for example by spin coating or slot coating. Alternatively, the adhesive layer 104 can be formed on a surface of the semiconductor workpiece 102 instead of, or in addition to, a surface of the support carrier 100.

Next, in FIG. 1D, the semiconductor workpiece 102 is bonded to the support carrier 100 by disposing the frontside of the semiconductor workpiece 102 in the bond interface of the adhesive layer 104 on the support carrier 100. Next, at FIG. 1E, after bonding, the next step is back-thinning of the semiconductor workpiece 104. The back-thinning of the semiconductor workpiece 104 can itself include a multistep process that can include mechanical back-grinding and subsequent stress relief etching and polishing. After back-thinning, of the semiconductor workpiece 104, the backside of the semiconductor workpiece 104 can be processed using standard wafer fab equipment. The support carrier 100 gives mechanical support and stability and protects the fragile edge of the thin semiconductor workpiece 102. Finally, when all backside processing is done, the next step at FIG. IF is for the semiconductor workpiece 102 to get debonded from the support carrier 100, which can result in the presence of unwanted adhesive residue 104a and 104b. Thus, the final step at FIG. 1G, is for semiconductor workpiece 102 and support carrier 100 to be cleaned and transferred to a film frame or to other output formats.

Many polymers or prepolymers or polymer precursors can be used as the film forming components to hold the semiconductor workpiece and support carrier pair together during subsequent processing and can be debonded cleanly at end of the processing. Any suitable polymers can be used so long they meet the specifications as required by the processing conditions such as low outgassing, film uniformity, solubility in solvents, temperature tolerance, etc. The polymers can be polyimides, rubbers, cyclic olefins, naphthalene resins, phenoxy resins, polyacrylates, polymethyl methacrylate, polyurethanes, polycarbonates, polyethylene terephthalate, cellulose, polyesters, polystyrenes, epoxies, silicones, polyamides, polysulfones, etc. or combination thereof. Prepolymers or polymer precursors that can be cured to form high molecular weight resins under electromagnetic wave radiation such as ultraviolet (UV) radiation can also be used. Electromagnetic wave curable chemicals can contain vinyl, acrylate, styrene, diene, methacrylate, allyl, thiol-ene, vinyl ether, unsaturated ester, imide, N-vinyl, acrylamide and/or methacrylic moieties.

A special type of polymers, called thermally decomposable, have been found to be good candidates as temporary bonding adhesive. The polymers can be thermally decomposed cleanly and quickly at certain temperatures such as above about 100° C. or about 200° C. These polymers can be well suited to be the film forming resins of temporary wafer bonding adhesive due to their easy of debonding. These polymers include poly(propylene carbonate) (PPC), poly(ethylene carbonate) (PEC), poly(butylene carbonate) (PBC), poly(cyclohexene carbonate) (PCHC), poly(limonene carbonate) (PLC), or poly(norbornene carbonate) (PNC), polynorbornenes (PNBs), and polyaldehydes, among others.

In some embodiments, solvents may include one or more of: n-methylpyrrolidone (NMP), dimethyl sulfoxide (DMSO), ethyl lactate ethyl acetate, butyl acetate, methyl ethyl ketone (MEK), propylene glycol methyl ethylene acetate (PGMEA), toluene, xylene, acetone, cyclopentenone, tetrahydrofuran (THF), dimethyl acetamide, hydrocarbons, cyclohexanone, or cyclic hydrocarbons, among others. In other embodiments, other solvents may be utilized as long as they are able to keep all the components in stable homogeneous or suspension state for desired period of time. In yet some other embodiments, the solvent may be water or other suitable liquid material.

In some embodiments, photo-initiators can be used as catalysts when UV curable resins are used. Examples of photo-initiators are those available from Ciba Geigy under the trademark IRGACURE, and those available from BASF under the trademark LUCIRIN TPO.

When thermally decomposable polymers are used as film forming resins, catalysts are mainly used to tune the thermal deposition temperature onsets. For example, iodonium salts can be used to lower the decomposition temperature for polycarbonates such as PPC. An example of an iodonium salt is (4-isobutyl-phenyl)-4-methylphenyl-iodonium hexafluorophosphate. Photoacid generator and amine salts can also be used as catalysts on polycarbonates. Thermal free radical initiators, for example, benzoyl peroxide can also be used as catalysts.

Additives or other minor components may be added to improve the adhesive properties such as mechanical strength, adhesive film continuity, void or foam existence, among others. Embodiments of additives include antioxidants and UV stabilizers, among others.

In some embodiments, the composition may further include one or more adhesion promoters capable of enhancing the bonding of the adhesive composition to the temporary semiconductor workpiece and support carrier pair. In some embodiments, adhesion promoters include silanes, titanates, zirconates, aluminates, metal containing compounds, zirconium aluminates.

Reference is made to FIG. 2 showing the schematic general structure of silanes or silicon-containing compounds as adhesion promoters according to the present disclosure. Selection of silane adhesion promoters is dependent upon the Resins ($R^1$-$R^4$) in the adhesive composition. In some embodiments, the $R^1$ group can contain various functional groups such as methacrylate, vinyl, epoxy, amino, ureido, metcapto, olefinic, isocyanate, among others. In some embodiments, the $R^2$, $R^3$, and/or $R^4$ groups can be the same organic groups or different groups made of mostly hydrocarbon or carbonyl containing hydrocarbons. Silicon (Si) should have at least one SiO group in the structure shown in FIG. 2. Also, in FIG. 2, $R^1$ can be any organic compound that can attach to Si. Typical R1 is propyl group with organic functional groups attached to the end, such as epoxy propyl or amino propyl.

Examples of silanes include those available from Gelest, Momentive, Dow Corning, or A-174, A-172, A-186, A-187, A-1100, A-1160, A-189, A-1310 from Momentive. In other embodiments, titanate, zirconate or zircoaluminate adhesion promoters can also be used in the adhesive composition. In some embodiments, titanium adhesion promoters can include those commercially available under the TYZOR name from DuPont; KR 55, from Kenrich Petrochemicals, Inc. In another embodiment, zirconium adhesion promoters include zircon aluminates. Examples of zirconate adhesion promoters include KZ 55 from Kenrich Petrochemicals, Inc. In some embodiments, the R1 group can be a long chain, hydrocarbon based, silicone based, ester based, urethane based, or even silane based, or mixtures of various organic groups.

In some embodiments, the composition may contain surfactants. The surfactants, made of one or more molecules, may function as wetting agent, leveling agent, or anti-foaming agent, to facilitate the temporary adhesive with making good contact with both the semiconductor workpiece and the support carrier, and with low voids and high film uniformity. Surfactants used in the adhesive composition can be anionic, cationic, nonionic, or zwitterionic, among others. The surfactants may also contain hydrocarbons, fluorinated groups, and siloxane groups, among others. Anionic surfactants may contain sulfate, sulfonate, phosphate and carboxylates, among others. Examples of anionic surfactants that can may be used in the currently disclosed adhesive composition may include ammonium lauryl sulfate, sodium lauryl sulfate (e.g., sodium dodecyl sulfate, SLS, or SDS), related alkyl-ether sulfates sodium laureth sulfate (e.g., sodium lauryl ether sulfate or SLES), sodium myreth sulfate, docusate (dioctyl sodium sulfosuccinate), perfluoro-octanesulfonate (PFOS), perfluorobutanesulfonate, alkyl-aryl ether phosphates, alkyl ether phosphates, alkyl carboxylates including without limitation sodium lauroyl sarcosinate, perfluorononanoate, perfluorooctanoate (PFOA or PFO). In some embodiments, cationic surfactants may include primary, secondary, tertiary amines and quaternary ammonium, among others. Examples of zwitterionic surfactants include, without limitation, (3-[(3-cholamidopropyl)dimethylammonio]-1-propanesulfonate) and cocamidopropyl hydroxysultaine, phospholipidsphosphatidylserine, phosphatidylethanolamine, and phosphatidylcholine.

In other embodiments, nonionic surfactants may be used in the adhesive composition as many of these surfactants contain only hydrocarbons and introduce no additional elements into the adhesive composition thereby reducing the possibility of contamination. Examples of nonionic surfactants include, without limitation, ethoxylates, fatty alcohol ethoxylates, alkyl phenol ethoxylates, fatty acid ethoxylates, ethoxylated amines, fatty acid amides, fatty acid esters of glycerol, fatty acid esters of sorbitol, fatty acid esters of sucrose, amine oxides, sulfoxides, and phosphine oxides.

In some embodiments, the composition may include polymeric surfactants as they contain fewer small molecules thus have low outgassing when used at high temperatures or vacuum. Examples of polymeric surfactants include polymers based on acrylic acid, methacrylic acid or salts thereof, hydroxyalkyl(meth) acrylic acid, aminoalkyl(meth)acrylic acid or salts thereof, 2-acrylamido-2-methylpropanesulfonic acid (AMPS) or salts, (meth)acrylamide or substituted (meth)acrylamides, vinylpyrrolidone, or vinylimidazole, among others. Commercially available polymeric surfactants may include polymeric amide hyperdispersants, available from Noveon under the trademark SOLSPERSE 32000 and 39000, and polypropylene oxide based ammonium salts, such as diethylpolypropoxy methyl ammonium chloride, available from Degussa under the trademark and designation VARIQUAT CC-59, and diethyl polypropoxy 2-hydroxy ammonium phosphate, available from Degussa under the trademark and designation VARIQUAT CC-42NS, and phosphate acid esters such as RHODAFAC RS-610 and RE 610, available from Rhodia and the like. In some embodiments, silicone containing surfactants may include polydimethyl siloxanes, silicone acrylates, and polyether modified polydimethylsiloxanes, among others. Other surfactants include those available from Tego Chemie (Degussa) under the trademark and designation TEGO RAD 2100, 2200N, 2250 and 2300 or the BYK UV 3500 series (3500, 3510, 3530, 3570) available from BYK Chemie or polyacrylates such as Modaflow from UCB, may also be utilized.

In one embodiment, defoamers may also be used as surfactants that can defoam the adhesive film, improve the film continuity, and reduce foam-void formations. In some embodiments, defoamers can be silicone defoamers, silicone free defoamers, polyacrylate defoamers, and mixtures thereof, among others. In other embodiments, defoamers including FOAM BLAST™, 20F FOAM BLAST™ 30, and FOAM BLAST™ 550 polyacrylate defoamers available from Lubrizol may be used. In some embodiments, TEGO AIREX™ 920 polyacrylate defoamer and TEGO AIREX™ 980 or FOAMEX N™ silicone based defoamers available from Degussa or BYK 1790 silicone-free defoamer from BYK Chemie may be used. In other embodiments, defoamers can also contain polyethylene glycol and polypropylene glycol copolymers, among others.

Examples of commercial surfactants can also include Dynol™ superwetting surfactants from Air Products, Capstone fluorinated surfactants from Dupont, Tergitol brand surfactants from Dow, DowFax brand from Dow, P and PT series from Dow.

The adhesive composition can be prepared in chemical reactors or containers, vessels, or mixers. The components can be added with or without heat and mixed using established mixing tools. The adhesive composition may require filtration, moisture, and contamination control to meet semiconductor processing requirements.

What is claimed is:

1. A method of manufacturing a semiconductor device, comprising:

providing a semiconductor workpiece and a support carrier in a manufacturing environment;

detecting at least one property of at least one of the semiconductor workpiece, the support carrier, and the manufacturing environment;

preparing an adhesive for temporarily bonding the semiconductor workpiece and the support carrier together, the preparing of the adhesive being based at least in part on the at least one property;

forming an adhesive layer of the adhesive on at least one of the semiconductor workpiece and the support carrier;

bonding the semiconductor workpiece to the support carrier through the adhesive layer;

back-thinning the semiconductor workpiece;

debonding the semiconductor workpiece from the support carrier; and cleaning the semiconductor workpiece and the support carrier to remove residues of the adhesive layer, wherein the preparing of the adhesive includes combining:

a first component comprising at least one of a resin and a resin precursor, the first component being configured to adhere to at least one of the semiconductor workpiece and the support carrier;

a second component to the first component, the second component comprising at least one surfactant that, when combined with the first component, functions as a wetting agent; and a solvent that, when combined with the first and second components, is configured to maintain resulting combination in liquid form.

2. The method of claim 1, wherein the preparing of the adhesive includes combining at least one additive to the first component, the second component, and the solvent.

3. The method of claim 2, wherein the at least one additive includes at least one of an antioxidation agent, a UV stabilizer, a photo initiator, a filler, and an adhesion promotor.

4. The method of claim 1, wherein
the second component further comprises at least one of a catalyst and an additives, the second component being configured for enhancing at least one of film forming capability, maintain a liquid form, thermal stability, and dissolution capability.

\* \* \* \* \*